United States Patent
Tanaka

(10) Patent No.: US 8,106,465 B2
(45) Date of Patent: Jan. 31, 2012

(54) SEMICONDUCTOR DEVICE

(75) Inventor: Kouji Tanaka, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 119 days.

(21) Appl. No.: 12/585,445

(22) Filed: Sep. 15, 2009

(65) Prior Publication Data

US 2010/0084717 A1   Apr. 8, 2010

(30) Foreign Application Priority Data

Oct. 3, 2008 (JP) ................. 2008-257918

(51) Int. Cl.
 *H01L 29/772* (2006.01)
 *H01L 29/78* (2006.01)
 *H01L 29/40* (2006.01)
 *H01L 29/49* (2006.01)

(52) U.S. Cl. ........ 257/407; 257/288; 257/316; 257/510; 257/213

(58) Field of Classification Search .......... 257/288, 257/407
See application file for complete search history.

(56) References Cited

U.S. PATENT DOCUMENTS

| | | | |
|---|---|---|---|
| 4,745,079 A * | 5/1988 | Pfiester | 438/306 |
| 5,998,848 A * | 12/1999 | Brown et al. | 257/407 |
| 6,100,143 A | 8/2000 | Brown et al. | |
| 6,914,311 B2 * | 7/2005 | Jung et al. | 257/407 |
| 7,307,320 B2 * | 12/2007 | Sun et al. | 257/368 |
| 7,335,958 B2 * | 2/2008 | Mouli | 257/407 |
| 2006/0163661 A1 * | 7/2006 | Wang et al. | 257/369 |
| 2006/0244079 A1 * | 11/2006 | Wang et al. | 257/407 |
| 2010/0032772 A1 * | 2/2010 | Tanaka | 257/394 |

FOREIGN PATENT DOCUMENTS

| | | |
|---|---|---|
| JP | 2000-101084 | 4/2000 |
| JP | 2004-303911 | 10/2004 |

* cited by examiner

*Primary Examiner* — Jerome Jackson, Jr.
*Assistant Examiner* — David Spalla
(74) *Attorney, Agent, or Firm* — McGinn IP Law Group, PLLC

(57) ABSTRACT

Provided is a semiconductor device in which occurrence of humps can be suppressed and variations in characteristics of the semiconductor device can be suppressed. The semiconductor device includes: an element isolation film (200) formed in a semiconductor layer, the element isolation film (200) defining an element formation region; a gate electrode (130) formed above the element formation region, the gate electrode (130) having ends respectively extending above the element isolation film (200); and impurity regions (110) which are to be a source region and a drain region which are formed in the element formation region so as to sandwich therebetween a channel formation region immediately under the gate electrode (130), the gate electrode (130) including at each of the ends thereof a high work function region (124) in which work function is higher than work function in other regions over at least a part of an interface between the element formation region and the element isolation film (200).

14 Claims, 4 Drawing Sheets

SEMICONDUCTOR DEVICE

BACKGROUND OF THE INVENTION

1. Field of the Invention

The present invention relates to a semiconductor device in which humps are suppressed.

2. Description of the Related Art

In recent years, in order to respond to demand for shrinking chip size, still higher integration of a transistor is required. One solution to this problem is an element isolation technology called shallow trench isolation (STI). However, when STI is adopted, a gate oxide film becomes thinner at an interface between a diffusion layer port ion and an STI port ion than at other port ions, and thus, a parasitic transistor is formed.

FIG. 4 is a graph illustrating a relationship between gate voltage and drain current in a transistor having a parasitic transistor formed therein. In FIG. 4, a curve A illustrates a relationship between gate voltage and drain current in a main transistor while a curve B illustrates a relationship between gate voltage and drain current in a parasitic transistor. Equivalently, a transistor having a parasitic transistor formed therein can be regarded as two transistors having different threshold voltages connected in parallel. Therefore, the relationship between gate voltage and drain current in a transistor having a parasitic transistor formed therein is as illustrated by a curve C which is a combination of the curves A and B. As illustrated by the curve C, when a parasitic transistor is formed, hump characteristics appear.

Japanese Patent Application Laid-open No. 2000-101084 discloses a conventional technology to suppress the hump characteristics. A field effect transistor described in Japanese Patent Application Laid-open No. 2000-101084 includes source and drain regions, a channel region between the source and drain regions, isolation regions in a substrate, and a gate including a gate dopant on the channel region. The gate includes a region in which the gate dopant is substantially depleted at least in a region in which the gate overlaps the channel region and the isolation region. It is thought that, because a threshold voltage in a channel corner region beneath the depletion region increases compared with that in the channel region between corner regions, the hump characteristics are improved.

Japanese Patent Application Laid-open No. 2004-303911 discloses a conventional technology which relates to a gate electrode, though this technology does not relate to improvement of the hump characteristics. A gate electrode of a metal insulated semiconductor FET (MISFET) described in Japanese Patent Application Laid-open No. 2004-303911 has an n+ region and a p+ region. Further, the two regions are connected by metal wiring in ohmic contact, which makes voltage at the n+ region always equal to voltage at the p+ region. Further, an element region of the MISFET including an n+ source region and an n+ drain region is isolated from other MISFETs by an insulating film for element isolation. A MISFET having such a structure has, in an off state, a small leakage current because of a high threshold and has, in an on state, a large ON current because of a low threshold.

However, in the technology disclosed in Japanese Patent Application Laid-open No. 2000-101084, an impurity diffuses in the depletion region from a region adjacent to the region. Therefore, concentration of the impurity in the depletion region varies widely, and, as a result, the characteristics of the semiconductor device varies widely.

SUMMARY OF THE INVENTION

According to the present invention, there is provided a semiconductor device including:

an element isolation film formed in a semiconductor layer, the element isolation film defining an element formation region;

a gate electrode formed above the element formation region, the gate electrode having ends respectively extending above the element isolation film; and a source region and a drain region which are formed in the element formation region so as to sandwich therebetween a channel formation region immediately under the gate electrode, the gate electrode including at each of the ends thereof a high work function region in which work function is higher than work function in other regions over at least a part of an interface between the element formation region and the element isolation film.

According to the present invention, the gate electrode includes at each of the ends thereof the high work function region in which the work function is higher than that in other regions over at least apart of the interface between the element formation region and the element isolation film. Therefore, a threshold voltage of a parasitic transistor is higher than a threshold voltage of a main transistor, and thus, occurrence of humps can be suppressed. Further, because a depletion region is not used, variations in characteristics of the semiconductor device can be suppressed.

DETAILED DESCRIPTION OF THE PREFERRED EMBODIMENT

Figure 1:
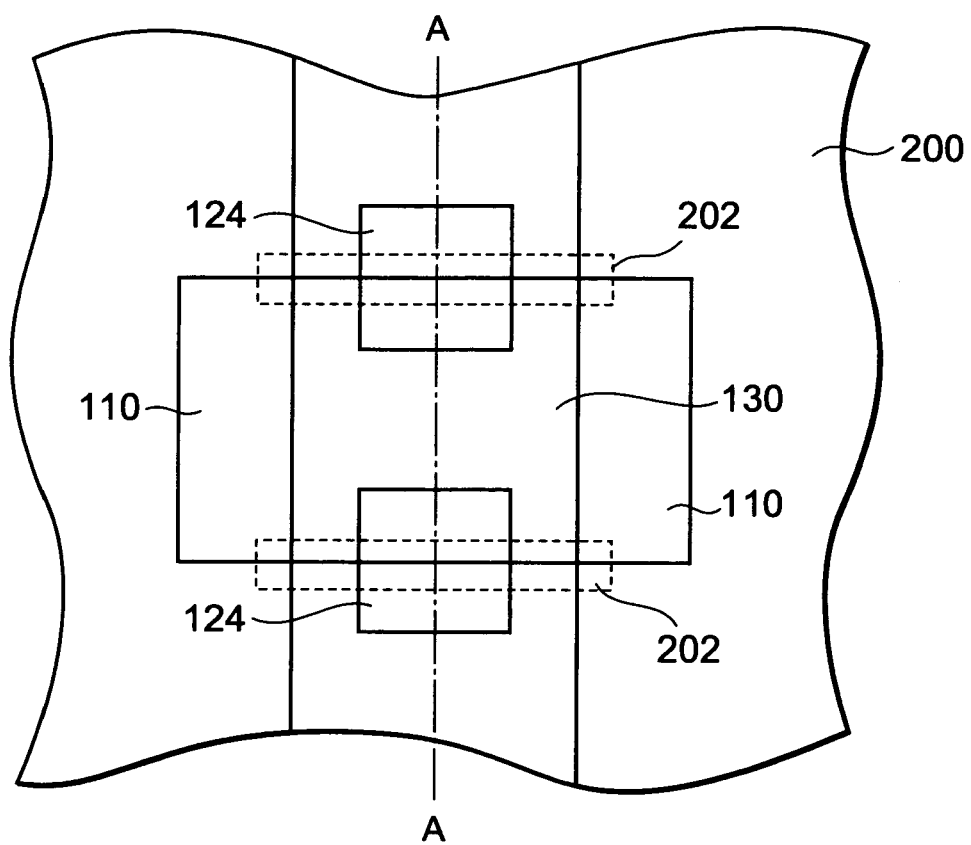
FIG. 1 is a schematic plan view illustrating a structure of a semiconductor device according to an embodiment of the present invention.

An embodiment of the present invention is now described below with reference to the attached drawings. It is to be noted that, throughout the drawings, like reference numerals denote like structural components and description thereof is omitted as appropriate.

FIG. 1 is a schematic plan view illustrating a structure of a semiconductor device according to this embodiment. The semiconductor device illustrated in FIG. 1 includes an element isolation film 200, a gate electrode 130, and two impurity regions 110 to be a source region and a drain region. The element isolation film 200 is formed in a semiconductor layer and defines an element formation region. The gate electrode 130 is formed above the element formation region. Each end of the gate electrode 130 extends over the element isolation film 200. The impurity regions 110 are formed in the element formation region so as to sandwich therebetween a channel formation region under the gate electrode 130.

Two regions of an interface between the element formation region and the element isolation film 200 which are positioned under the gate electrode 130 are parasitic transistor regions 202. A parasitic transistor is formed in each parasitic transistor region 202. In this embodiment, the gate electrode 130 includes high work function regions 124 in which the work function is higher than that in other regions. Each of the high work function regions 124 is formed in at least a part of one of the two regions located over the interface between the element formation region and the element isolation film 200, that is, over the parasitic transistor regions 202. Therefore, a threshold voltage at the interfaces between the element formation region and the element isolation film 200, that is, a threshold voltage of the parasitic transistors is higher than a threshold voltage of a transistor main body, and, as a result, occurrence of humps can be suppressed. Further, because a depletion region is not used, variations in characteristics of the semiconductor device can be suppressed.

Figure 2:
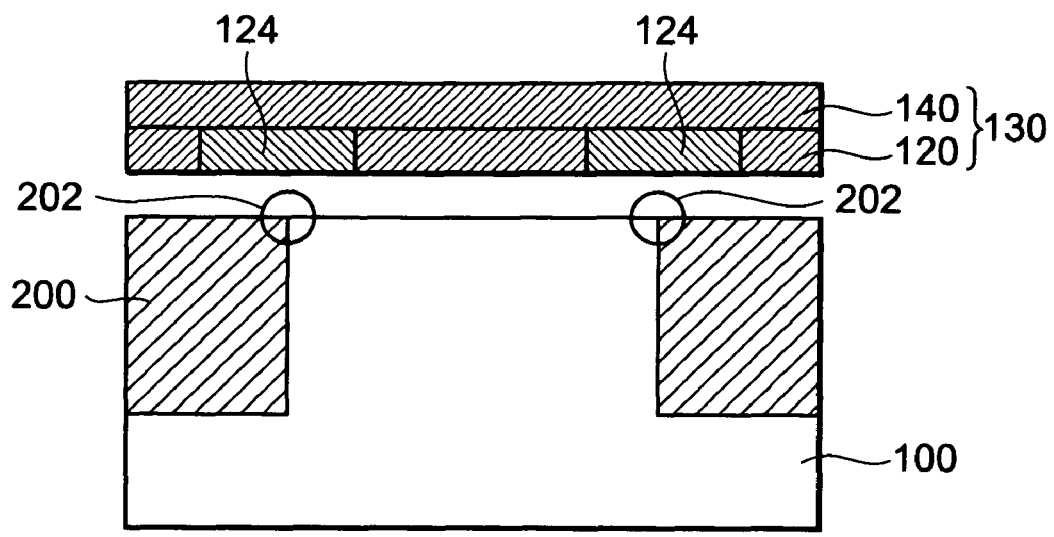
FIG. 2 is a cross-sectional view taken along the line A-A' of FIG. 1.

FIG. 2 is a cross-sectional view taken along the line A-A' of FIG. 1. A semiconductor layer 100 is, for example, a silicon wafer or a silicon layer of a silicon-on-insulator (SOI) substrate. The semiconductor layer 100 located in the channel formation region of the element formation region is of a first conductivity type (for example, a p type). The impurity regions 110 illustrated in FIG. 1 are of a second conductivity type (for example, an n type). The element isolation film 200 has, for example, a shallow trench isolation (STI) structure.

The gate electrode 130 has a polysilicon pattern 120. The polysilicon pattern 120 is of the second conductivity type except for the high work function regions 124. The high work function regions 124 are of the first conductivity type.

In a field effect transistor, the work function of a gate electrode when the conductivity type of a polysilicon layer which forms the gate electrode is the same as that of a semiconductor layer serving as a substrate is larger than the work function of the gate electrode when the conductivity type of the polysilicon layer is opposite to that of the semiconductor layer. Therefore, when the polysilicon pattern 120 has the high work function regions 124 of the first conductivity type as in this embodiment, the threshold voltage of the parasitic transistors becomes higher in the regions under the high work function regions 124, and thus, occurrence of humps can be suppressed.

Further, seen in a direction in which the gate electrode 130 extends, the high work function regions 124 completely cover the parasitic transistor regions 202. Therefore, the threshold voltage of the parasitic transistors as a whole becomes still higher, and thus, occurrence of humps can be further suppressed.

Further, seen in the direction in which the gate electrode 130 extends, the high work function regions 124 are also formed before and beyond edges of the parasitic transistor regions 202. Therefore, even in the case of mask displacement in the direction in which the gate electrode 130 extends, the high work function regions 124 can cover the parasitic transistor regions 202.

Further, the high work function regions 124 face neither of the two impurity regions 110, and all the regions of the polysilicon pattern 120 which face the impurity regions 110 are of the second conductivity type. Therefore, even in the case of mask displacement in a width direction of the gate electrode 130, an impurity of the first conductivity type is prevented from being introduced into the impurity regions 110 to make the impurity regions 110 partly of the first conductivity type.

It is to be noted that the gate electrode 130 includes a conductive layer 140 over the polysilicon pattern 120. Therefore, even when the high work function regions 124 are formed, increase in resistance of the gate electrode 130 can be suppressed. The conductive layer 140 is, for example, a silicide layer.

Figure 3A:
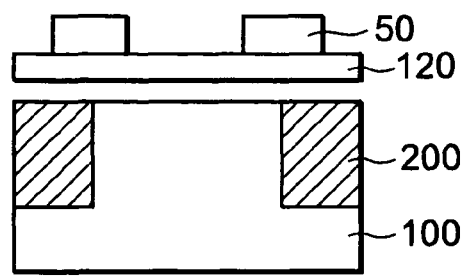
FIGS. 3A to 3E are cross-sectional views for illustrating a method of forming high work function regions illustrated in FIGS. 1 and 2.

FIGS. 3A to 3E are cross-sectional views for illustrating a method of forming the high work function regions 124 illustrated in FIGS. 1 and 2. As illustrated in FIG. 3A, the element isolation film 200, a gate insulating film (not shown), and the polysilicon pattern 120 are formed on the semiconductor layer 100. First, a resist pattern 50 is formed on the polysilicon pattern 120. The resist pattern 50 covers regions of the polysilicon pattern 120 in which the high work function regions 124 are to be formed.

Figure 3B:
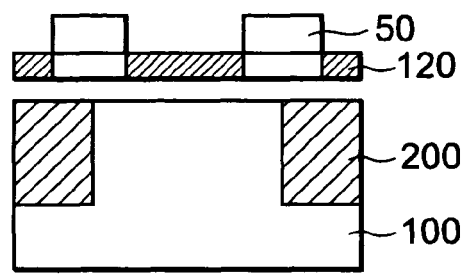

Then, as illustrated in FIG. 3B, an impurity of the second conductivity type is introduced into the semiconductor layer 100 and the polysilicon pattern 120 with the polysilicon pattern 120 and the resist pattern 50 being used as a mask. This forms the impurity regions 110 in the element formation region, and, regions of the polysilicon pattern 120 which are not covered with the resist pattern 50 are made to be of the second conductivity type. It is to be noted that the impurity of the second conductivity type is not introduced into the regions in which the high work function regions 124 are to be formed.

Figure 3C:
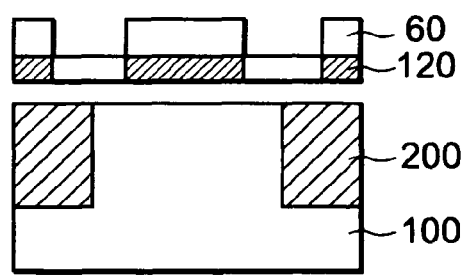

After that, as illustrated in FIG. 3C, the resist pattern 50 is removed, and then, a resist pattern 60 is formed on the polysilicon pattern 120. The resist pattern 60 covers the polysilicon pattern 120 except for the regions in which the high work function regions 124 are to be formed, and covers the impurity regions 110.

Figure 3D:
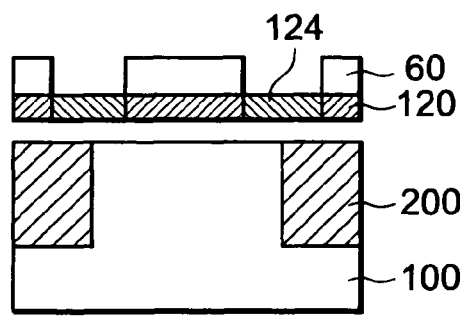

Then, as illustrated in FIG. 3D, the impurity of the first conductivity type is introduced with the resist pattern 60 being used as a mask. This forms the high work function regions 124 in the polysilicon pattern 120. It is to be noted that, in the case where the transistor to be formed is a complementary metal oxide semiconductor (CMOS) transistor, a source region and a drain region of a transistor of a first channel type may be formed in this step.

Figure 3E:
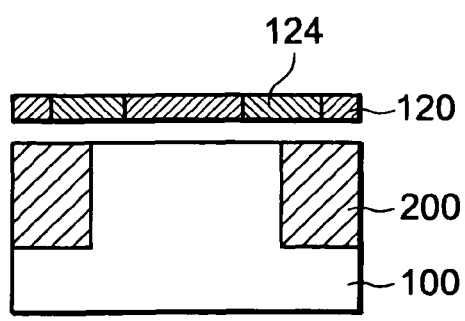
Figure 4:
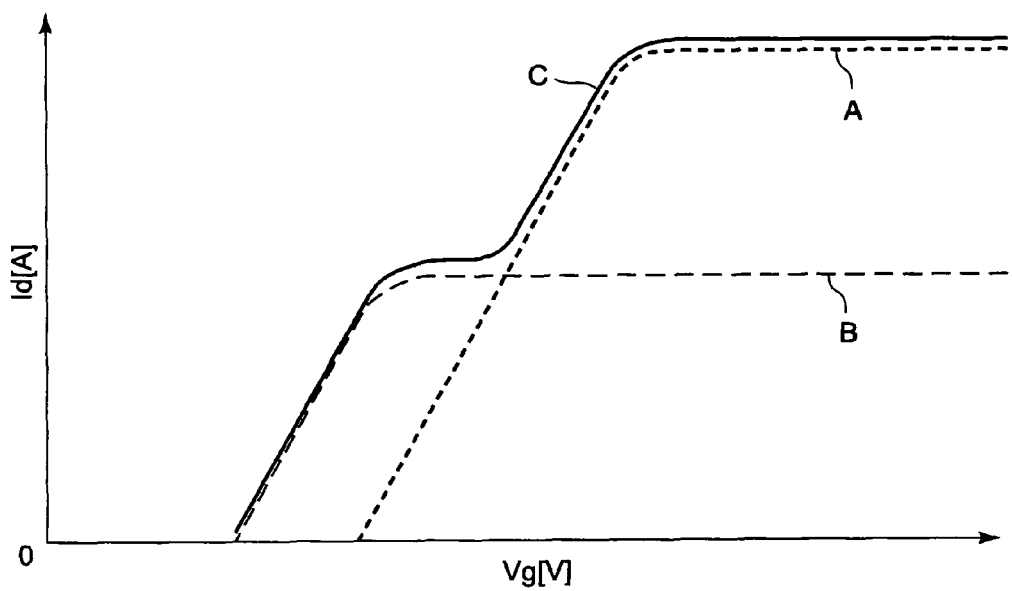
FIG. 4 is a graph illustrating a relationship between gate voltage and drain current in a transistor having a parasitic transistor formed therein.

After that, as illustrated in FIG. 3E, the resist pattern 60 is removed.

As described above, according to this embodiment, the gate electrode 130 includes the high work function regions 124 in which the work function is higher than that in other regions in at least a part of its two regions located over the parasitic transistor regions 202. Therefore, the threshold voltage of the parasitic transistors is higher than the threshold voltage of the main transistor, and thus, occurrence of humps is suppressed. Accordingly, variations in characteristics of the transistor can be suppressed, and off-leakage current can be reduced. Further, because a depletion region is not used, variations in characteristics of the field-effect transistor can be suppressed.

Further, the high work function regions 124 face neither of the two impurity regions 110. Therefore, even in the case of mask displacement in the width direction of the gate electrode 130, the impurity of the first conductivity type is prevented from being introduced into the impurity regions 110 to make the impurity regions 110 partly of the first conductivity type.

It is to be noted that the gate electrode 130 includes the conductive layer 140 over the polysilicon pattern 120. Therefore, even when the high work function regions 124 are formed, increase in resistance of the gate electrode 130 can be suppressed.

The embodiment of the present invention has been described above with reference to the attached drawings, but the embodiment is merely illustrative of the present invention and various other structures may be adopted. For example, when it is not necessary to take mask displacement into consideration, the high work function regions 124 may be formed in the whole polysilicon pattern 120 seen in the width direction of the gate electrode 130. Further, the first conductivity type is the p type while the second conductivity type is the n type in this embodiment, but the first conductivity type may be the n type and the second conductivity type may be the p type. Still further, the high work function regions 124 are formed by changing the conductivity type of the polysilicon pattern 120 in this embodiment, but the high work function regions 124 may be formed by other methods.

Further, in the step described with reference to FIG. 3B, the impurity of the second conductivity type may also be introduced into the regions in which the high work function regions 124 are to be formed. In this case, in the step described with reference to FIG. 3D, the amount of the impurity of the first conductivity type to be introduced is set so that the conductivity type of the regions in which the high work function regions 124 are to be formed is reversed.

Further, the work function of the high work function regions 124 may be made to be relatively higher than that in other regions by making different the material forming the high work function regions 124 from the material forming other regions of the gate electrode 130.

In this way, the high work function regions 124 may be formed in various ways.

What is claimed is:

1. A semiconductor device, comprising:
an element isolation film formed in a semiconductor layer, the element isolation film defining an element formation region;
a gate electrode formed above the element formation region, the gate electrode having ends respectively extending above the element isolation film; and
a source region and a drain region which are formed in the element formation region to sandwich therebetween a channel formation region under the gate electrode,
wherein the gate electrode comprises at each of the ends thereof a high work function region in which a work function is higher than a work function in other regions over at least a part of an interface between the element formation region and the element isolation film,
wherein the semiconductor layer located in the channel formation region is of a first conductivity type;
wherein the gate electrode is of a second conductivity type,
wherein the high work function region comprises a region of the first conductivity type which is formed in a part of the gate electrode and is located over the interface, and
wherein the gate electrode comprises:
a semiconductor pattern of the second conductivity type;
the region of the first conductivity type which is formed in the semiconductor pattern and which comprises the high work function region; and
a conductive layer formed over the semiconductor pattern.

2. A semiconductor device according to claim 1, wherein the region of the first conductivity type faces neither the source region nor the drain region.

3. A semiconductor device according to claim 1, further comprising:
parasitic transistor regions formed in the interface between the element formation region and the element isolation film.

4. A semiconductor device according to claim 3, wherein the parasitic transistor regions are positioned under the gate electrode.

5. A semiconductor device according to claim 3, wherein the high work function region is formed over the parasitic transistor regions.

6. A semiconductor device according to claim 3, wherein, in a direction in which the gate electrode extends, the high work function region is formed before and beyond edges of the parasitic transistor regions.

7. A semiconductor device according to claim 1, wherein the first conductivity type is different from the second conductivity type.

8. A semiconductor device according to claim 1, wherein regions of the gate electrode that face the source region and the drain region are of the second conductivity type.

9. A semiconductor device according to claim 1, wherein the semiconductor pattern comprises a polysilicon pattern that abuts side surfaces of the high work function region.

10. A semiconductor device according to claim 9, wherein the conductive layer abuts an upper surface of the high work function region.

11. A semiconductor device according to claim 10, wherein the conductive layer further abuts an upper surface of the polysilicon pattern.

12. A semiconductor device according to claim 11, wherein the conductive layer comprises a silicide layer.

13. A semiconductor device according to claim 12, wherein the polysilicon pattern is disposed between the conductive layer and the element isolation film.

14. A semiconductor device according to claim 13, wherein, in a plan view, an entirety of an upper surface of the element isolation film overlaps with the polysilicon pattern and the high work function region.

* * * * *